United States Patent [19]

Kelly

[11] Patent Number: 4,803,621
[45] Date of Patent: Feb. 7, 1989

[54] MEMORY ACCESS SYSTEM

[75] Inventor: Edmund J. Kelly, San Jose, Calif.

[73] Assignee: Sun Microsystems, Inc., Mountain View, Calif.

[21] Appl. No.: 890,075

[22] Filed: Jul. 24, 1986

[51] Int. Cl.⁴ .................... G06F 13/00; G11C 7/00
[52] U.S. Cl. ........................... 364/200; 365/230
[58] Field of Search .............. 365/231, 238, 230; 364/200 MS File, 900 MS File

[56] References Cited

U.S. PATENT DOCUMENTS

| 3,394,354 | 7/1968 | Senzig | 364/200 |
|---|---|---|---|
| 3,413,613 | 11/1968 | Bahrs et al. | 364/200 |
| 4,081,701 | 3/1978 | White, Jr. et al. | 365/203 X |
| 4,106,109 | 8/1978 | Fassbender | 365/238 |
| 4,156,290 | 5/1979 | Lanza | 365/238 X |
| 4,156,905 | 5/1979 | Fassbender | 364/200 |
| 4,368,515 | 1/1983 | Nielsen | 364/200 |
| 4,527,232 | 7/1985 | Bechtolsheim | 364/200 |
| 4,550,368 | 10/1985 | Bechtolsheim | 364/200 |

Primary Examiner—Gary V. Harkcom
Assistant Examiner—Mark K. Zimmerman
Attorney, Agent, or Firm—Blakely Sokoloff Taylor & Zafman

[57] ABSTRACT

A memory architecture having particular application for use in computer systems employing virtual memory techniques. A processor provides row and column addresses to access data stored in a dynamic random access memory (DRAM). The virtual address supplied by the processor includes high and low order bits. In the present embodiment, the high order bits represent a virtual row address and the low order bits represent a real column address. The virtual row address is applied to a memory management unit (MMU) for translation into a real row address. The real column address need not be translated. A comparator compares the current virtual row address to the previous row address stored in a latch. If the current row and previous row addresses match, a cycle control circuit couples the real column address to the DRAM, and applies a strobe signal such that the desired data is accessed in the memory without the need to reapply the row address. If the row addresses do not match, the cycle control circuit initiates a complete memory fetch cycle and applies both row and column addresses to the DRAM, along with the respective strobe signals. By properly organizing data in the memory, the probability that sequential memory operations access the same row in the DRAM may be significantly increased. By using such an organization, the present invention provides data retrieval at speeds on the order of a cache based memory system for a subset of data stored.

15 Claims, 3 Drawing Sheets

4,803,621

MEMORY ACCESS SYSTEM

BACKGROUND OF THE INVENTION

1. Field of the Invention

The present invention relates to memory systems for computers, and more particulary, to methods and apparatus for increasing data access speed and efficiency.

2. Art Background

In many data processing systems, it is common to utilize a high speed buffer memory, referred to as a "cache" coupled to a central processing unit (CPU) to improve the average memory access time for the processor. The use of a cache is based upon the premise that over time, a data processing system will access certain localized areas of memory with high frequency. The cache typically contains a subset of the complete data set disposed in the main memory, and can be accessed very quickly by the CPU without the necessity of reading the data locations in the main memory.

The use of a cache adds considerable complexity to a data processing system and substantially increases system cost. Historically, memory access requirements were such to justify the increased expense and complexity of cache based architectures. In new generation Reduced Instruction Set Computers (RISC) processing speeds require single cycle memory access. Most modern memory systems untilize dynamic random access memories (DRAMs) which generally have 200 nanosecond cycle times ("cycle" time being the time from the initiation of the memory access until data can again be provided by the memory device). Although typical DRAMs provide 200 nanosecond cycle times, the column access/cycle time for the particular device is generally only 45 nanoseconds (where "access" time is the time from the application of a column address signal (CAS) until data is provided on a data bus). Accordingly, the cycle time for a commercially available DRAM may be up to five times the column access/cycle time for the same device.

As will be described, by properly allocating data storage in the DRAM memory and using the teachings of the present invention, the main memory of the computer may be effectively used as a cache. The present invention discloses apparatus and methods for use in a computer system to quickly and efficiently access the computer's main memory to obviate the need for a separate cache. The present invention utilizes static column DRAMs in an architecture which permits very fast access to a localized subset of the main memory, and is particularly suited for use in systems employing virtual memory techniques.

SUMMARY OF THE INVENTION

An improved memory architecture is disclosed, having particular application for use in computer systems employing virtual memory techniques. A processor provides row and column addresses to access data stored in a dynamic random access memory (DRAM). The virtual address supplied by the processor includes high and low order bits. In the present embodiment, the virtual high order bits represent the row address and the low order bits represent a real column address. The virtual row address is applied to a memory management unit (MMU) for translation into a real row address. The real column address need not be translated. A comparator compares the current virtual row address to the previous row address stored in a latch. If the current row and previous row addresses match, a cycle control circuit couples the real column address to the DRAM, and applies a CAS signal such that the desired data is accessed in the memory without the need to reapply the row address. If the row addresses do not match, the cycle control circuit initiates a complete memory fetch cycle and applies both row and column addresses to the DRAM, along with the respective RAS and CAS signals and updates the contents of the latch. By properly organizing data in the memory, the probability that sequential memory operations access the same row in the DRAM may be significantly increased. By using such an organization, the present invention provides data retrieval at speeds on the order of a cache based memory system for a subset of data stored. Data stored along the same row in the DRAM may be accessed at speeds four to five times faster then the time required for a complete memory fetch cycle.

DETAILED DESCRIPTION OF THE INVENTION

An improved memory architecture is disclosed, having particular application for use in computer systems employing virtual memory techniques. In the following description for purposes of explanation, specific memory devices, data rates, architectures, and components are set forth in order to provide a thorough understanding of the present invention. However, it will be apparent to one skilled in the art that the present invention may be practised without these specific details. In other instances, well known circuits are shown in block diagram form in order not to obscure the present invention unnecessarily.

Figure 1:
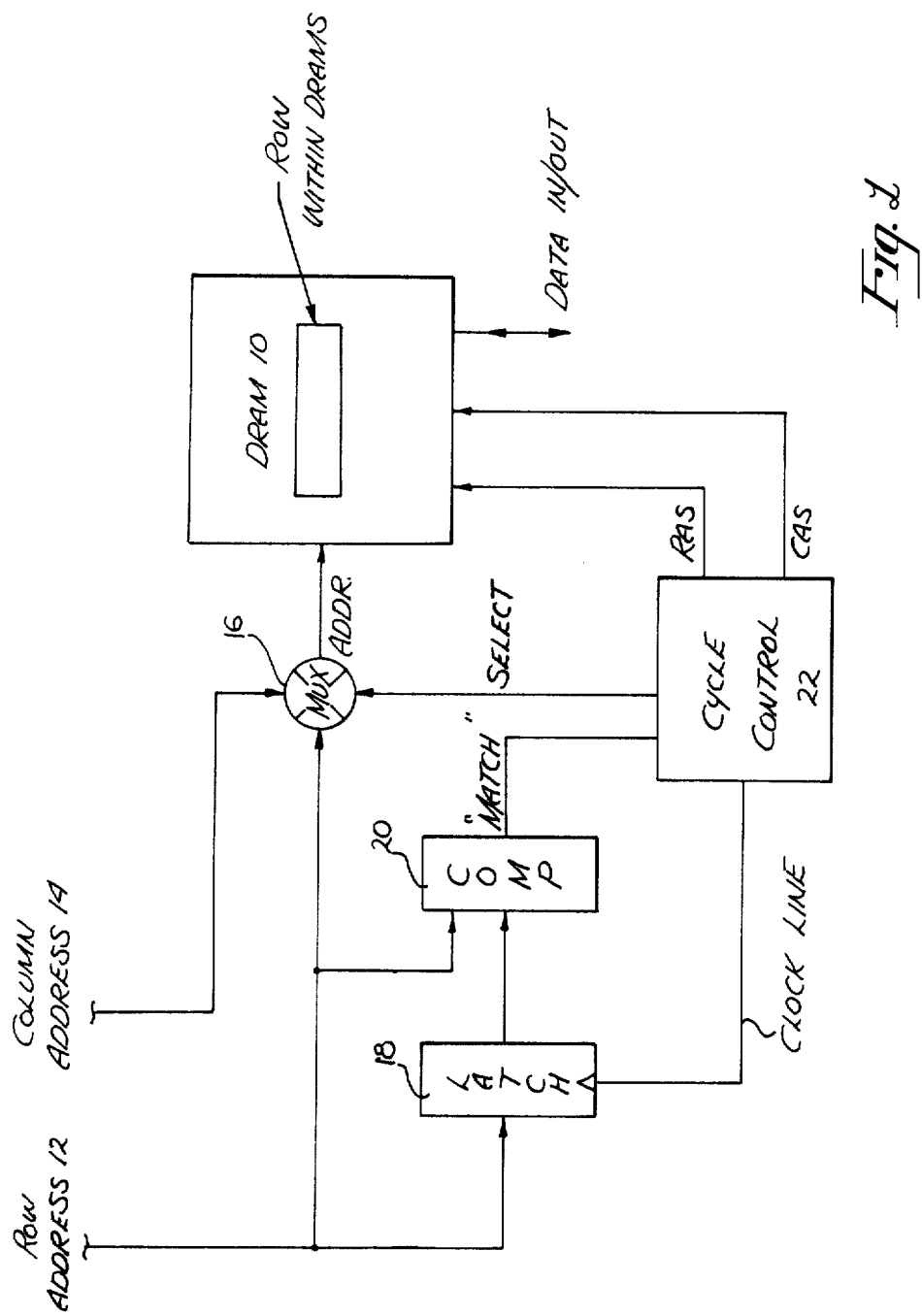
FIG. 1 is a block diagram conceptually illustrating the nature of the present invention.

With reference to FIG. 1, the present invention is disclosed conceptually in block diagram form. A dynamic random access memory (DRAM) 10 comprises one memory device of a data processing system. In the present embodiment, DRAM 10 includes a memory array of the type having row and column addresses identifying the location of data within the array. DRAM 10 may comprise a one megabit CMOS dynamic RAM with static column access. In such memory devices, the cycle time from the initiation of the memory access to the output of desired data is on the order of 200 nanoseconds. Data is accessed from DRAM 10 by first providing a row address, which identifies a particular row within the memory array in which the data is located, along with a row address strobe (RAS) signal. A column address is then provided to DRAM 10 which identifies the particular column within the enabled row having the desired data, along with a column address strobe (CAS) signal. Typically, in static column DRAMs the time from the application of the column address and CAS signal to the output of data by the device is approximately 45 nanoseconds. The time period from the application of the column address and CAS signal to the output of data is referred to as the "column access" time of the memory device. Accordingly, a memory cycle is approximately five times the length of the column access/cycle speed of the device.

In certain static column DRAM memory devices, once the row address and RAS strobe signal have been applied, any data element disposed within the enabled row may be accessed by applying the appropriate column address and CAS signal, without the necessity of reapplying the row address and RAS signal. As noted, access to data stored within a previously enabled row may occur very quickly (approximately 45 nanoseconds) as opposed to accessing data stored in another row within the memory array.

It is common in high speed data-processing applications to use a "cache" memory coupled to a central processing unit to improve the average access time for the processor. The cache contains a subset of data located within the main memory of the system, and can be accessed very quickly by the processor without the necessity of reading the data locations in main memory. It is generally assumed that in high speed processing systems that a cache memory is required to achieve single cycle memory access by the processor. However, as previously noted, the use of a cache significantly increases the complexity and cost of the data processing system. As will be described in this Specification, the present invention provides a memory system which obviates the need for a cache, yet provides high-speed access to localized areas within main memory. It will be appreciated by one skilled in the art, that if data is appropriately arranged within DRAM 10 (FIG. 1), that any data element disposed in a previously enabled row may be accessed within a single clock cycle of the system. Accordingly, by properly storing data within the memory array, a localized subset of the main memory may be effectively used as a cache by the processor.

Referring once again to FIG. 1, a processor (not shown) provides a row address 12 and a column address 14 to access desired data stored within DRAM 10. The column address 14 is applied to a multiplexer 16, which, as will be described, selectively applies either the row or column address to DRAM 10. Row address 12 is applied to a latch 18 and a comparator 20. A cycle control circuit 22 is coupled to latch 18, comparator 20, as well as multiplexer 16, and provides both the RAS and CAS signals to DRAM 10 to access data. Upon application of an initial row address 12 and column address 14 to the memory system disclosed in FIG. 1, comparator 20 compares the current row address 12 (RA(i)) with the previous row address (RA(i−1)) which had been used to access data on the previous full RAS, CAS memory cycle. If the row address stored within the latch does not match the current row address supplied by the processor, cycle control 22 clocks latch 18, such that the current row address is then stored within the latch, and signals multiplexer 16 to apply the current row address 12 to DRAM 10. Cycle control 22 further issues a RAS signal to DRAM 10 such that the desired row within the memory array is enabled. Cycle control 22 then applies column address 14 through multiplexer 16 to the DRAM 10, and issues an appropriate CAS signal to the DRAM which identifies the particular data to be accessed in the array. The DRAM 10 then provides the selected data to the processor, typically over a data bus (not shown).

In the event that the current row address RA(i) is the same as the previous row address RA(i−1) stored in latch 18, cycle control 22 applies the current column address 14 to DRAM 10 and issues a CAS signal. As previously discussed, once a particular row within DRAM 10 is enabled, access to a data element within that row may be done very quickly. In the embodiment illustrated in FIG. 1, it will be appreciated that it is only necessary to apply the column address 14 to DRAM 10 to access data stored within a row enabled on a previous data cycle. Accordingly, in the case where the current row address is the same as the immediately preceeding row address, it is not necessary to reapply the current row address to the DRAM and provide an additional RAS signal, but rather, it is only necessary to apply the current column address and apply the CAS signal to access the memory. In a typical application, the use of the present invention permits access to data stored within DRAM 10 in approximately 45 nanoseconds instead of the typical 200 nanoseconds.

As will be appreciated by one skilled in the art, in a working memory system multiple banks of memory must be utilized rather than a single dynamic RAM. In order to render the system outlined in FIG. 1 practical, it is necessary to arrange data within multiple banks of memory, such that probability of multiple sequential accesses to the same row within a memory bank is significantly increased. If frequently used data may be localized within the memory in this manner, main memory may be utilized in place of a much more expensive and complex cache system.

Figure 2:
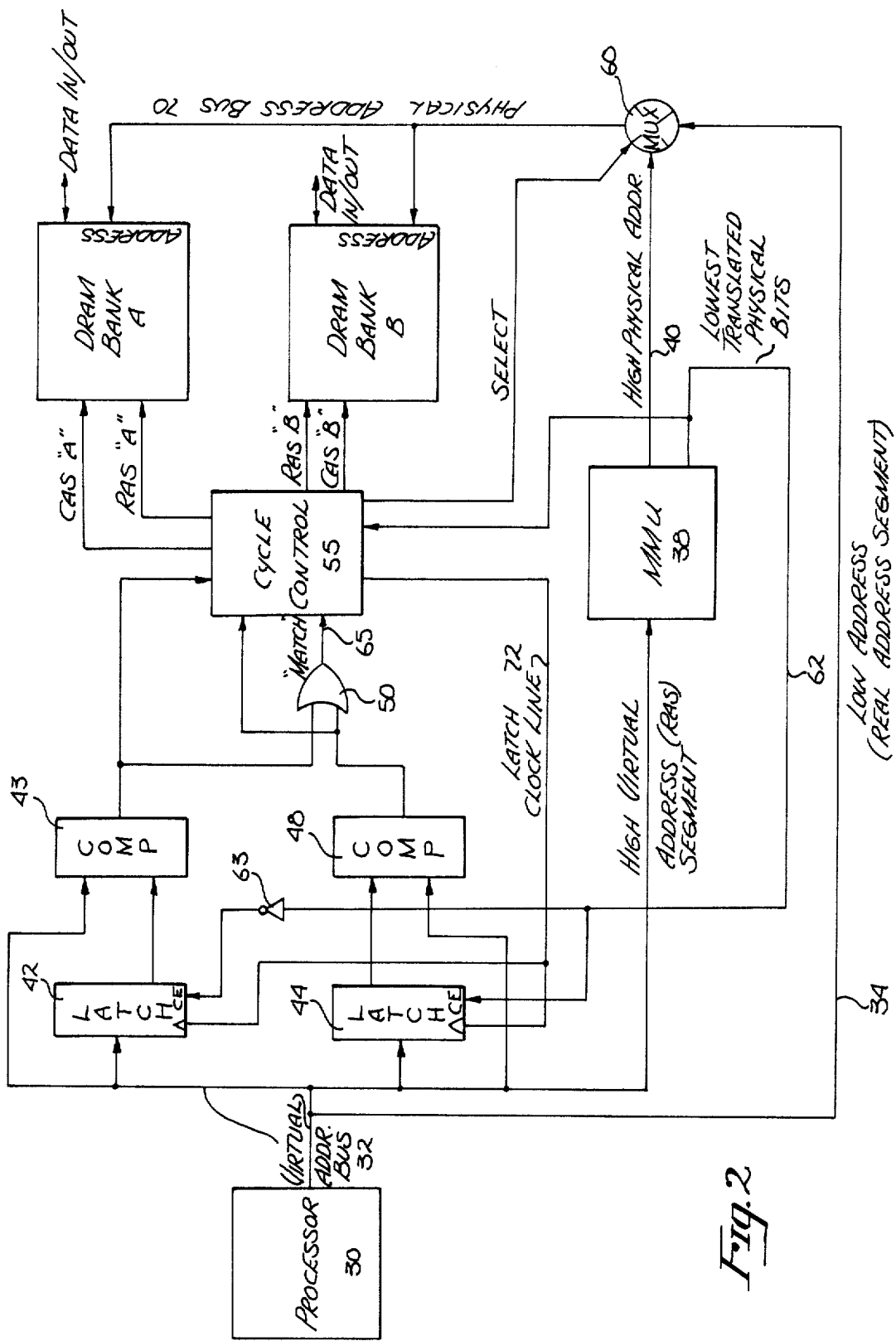
FIG. 2 is a more detailed block diagram illustrating an example of the presently preferred embodiment of the invention.

Referring now to FIG. 2, the present invention will be illustrated and described with reference to an embodiment having two memory banks, DRAM bank "A" and DRAM bank "B" in a data processing system utilizing virtual memory techniques. For purposes of this Specification, and in order to avoid unnecessary complication, only those address, control and data lines necessary to illustrate the present invention have been disclosed in the Figures. However, it will be apparent to one skilled in the art that other lines, devices, and support circuitry may be required in any particular application.

A processor 30 communicates with the memory system of the present invention along a virtual address bus 32. Virtual address bus 32 includes a plurality of individual lines which carry addresses in the form of multi-bit words with one bit applied to each line. Typically, processors may use address buses having between 16 and 32 bits. In the present invention, addresses transmitted over virtual address bus 32 are structured such that low ordered bits form a direct (real) address segment for the DRAM memory, with the low order bits being separated from the virtual address bus 32 along line 34. As will be described more fully below, the low order (real) address bits comprise the column address for desired data stored within DRAM bank A and DRAM bank B. High order address bits form a virtual address segment corresponding to the row address for data stored within the main memory DRAM banks A and B. (See, for example, U.S. Pat. Nos. 4,527,232 and 4,550,368, assigned to the Assignee of the present application.)

The high order bits comprising the virtual address segment are retained on the virtual address bus 32. As illustrated, the high order virtual bits are applied to a memory management unit (MMU) 38 for translation into a high order physical address. In the present embodiment, MMU 38 is a relatively high speed random access memory unit, such as a fast static RAM. The MMU 38 takes as an input the high order virtual address supplied by processor 30 and provides as an output a translated physical (real) address along line 40, which specifies the actual physical row address of the desired data in DRAM banks A and B. MMU 38 may take the form of the memory management unit described in U.S. Pat. No. 4,527,232, the disclosure of which is incorporated herein by reference.

A latch 42 is coupled to virtual address bus 32 and a comparator 43 is coupled to both the virtual address bus 32 as well as to the latch 42. Similarly, a latch 44 is coupled to virtual address bus 36 and is in turn coupled to a comparator 48, such that the comparator 48 compares the contents of latch 44 with the current virtual address supplied over virtual address bus 32 from processor 30. As illustrated, the outputs of comparators 43 and 48 are passed through an OR gate 50 and are coupled to a cycle control circuit 55. The result of the OR operation between the outputs of comparators 43 and 48 are similarly coupled to cycle control 55. Cycle control circuit 55, as will be described more fully below, controls the clocking of latches 42 and 44, the selection of multiplexer 60, as well as provides appropriate RAS and CAS signals to DRAM banks A and B.

MMU 38 provides the lowest translated physical bits of the virtual address supplied by processor 30 to the chip enable (CE) port of latches 42 and 44 over line 62. The state of the lowest translated physical bits (in the present example for two memory banks only the lowest translated physical bit is required) may be used to select either latch 42 or latch 44. For example, if the lowest translated physical bit is a logical 0, this bit would be applied to latch 44 (but since it is a 0 it would not enable latch 44) and would be inverted by an inverter 63 to a logical 1 which would be applied to latch 42, thereby enabling latch 42. Conversely, latch 44 would be enabled in the event the lowest translated physical bit of the virtual address is a logical 1. As illustrated in FIG. 2, the lowest translated physical bit is also supplied to cycle control 55, and this bit (or bits in the case of more than two memory banks) identifies to cycle control 55 which DRAM bank data is to be accessed from.

Assume for sake of example, that the processor 30 provides a virtual address over virtual address bus 32 which corresponds to data disposed in DRAM bank A. As previously described, the low order bits corresponding to the column address within the bank comprise a real address segment, and are separated and passed over line 34 to multiplexer 60. The virtual segment of the address corresponding to the row address within DRAM bank A is applied to virtual address bus 32, and is immediately translated by MMU 38 such that the translated high order bits are coupled along line 40 to multiplexer 60. In addition, the lowest translated physical bit is coupled over line 62 to latches 42 and 44. For purposes of the present example, it is assumed that if the lowest translated physical bit is a logical 0, latch 42 is enabled since the logical 0 will be inverted to a logical 1 by inverter 63. The virtual address is concurrently applied to enabled latch 42 as well as to comparator 43. It will be noted that although the current virtual row address is applied to latch 42, that latch 42 contains the preceeding virtual row address, and will continue to contain the preceeding virtual row address until the latch is clocked.

Comparator 43 compares the current virtual row address to the preceeding virtual row address stored in latch 42. The output of comparators 43 and 48 are coupled to OR gate 50 and cycle control 55. In the event that either comparator 43 or comparator 48 identifies a match between the current row virtual address and the contents of the latches, OR gate 50 will indicate that a match exists and provide a signal over line 65 to cycle control 55. The output of each comparator is also coupled directly to cycle control 55 to identify which latch-/comparator circuit identified the match. In the current example, where a match exists between the current row virtual address and the contents of latch 42, cycle control 55 signals multiplexer 60 couple the real address segment comprising the column address to physical address bus 70 and DRAM bank A. Cycle control 55 also provides the necessary column address signal (CAS A). DRAM bank A then provides the desired data to a data bus (not shown) within the access time of the static column dynamic RAM (approximately 45 nanoseconds). Accordingly, in the case where a match exists, the present invention does not reapply the virtual row address nor is an additional RAS signal required, to access desired data. It will be noted by one skilled in the art that typically CAS signal lines are in a normally high state and are set low for data access, whereas RAS lines are in a normally low state and remain low for data access. Moreover, reference is made to FIG. 3 which sets forth the sequence of operations of the present invention as described herein.

In the event that there is no match between the current virtual row address and the previous row address stored in latch 42, cycle control 55 signals multiplexer 60 to couple the translated (now real) row address on line 40 to memory bank A along physical address bus 70. Concurrently, cycle control 55 issues a RAS high signal to bank A and provides a clock signal along clock lines 72 which clocks the enabled latch, namely latch 42, such that the current virtual row address is stored therein. The RAS line is then brought to a low condition and mutiplexer 60 then applies the real address segment defining the column address to bank A and applies a low CAS signal. After completing this full memory cycle access including the updating of latch 42, and the application of the row and column addresses along with their respective strobes, data is provided by memory bank A to the processor along the data bus (not shown). It will be appreciated by one skilled in the art, that in the event that a full memory access cycle is required, that the time for the present invention to obtain the desired data is generally the same as that in other computer systems using standard memory access techniques to acquire data in a computer main memory. However, in those instances where a match occurs between the current virtual row address and the previously stored virtual row address, significant advantages in memory access speed are achieved by the present invention.

It will be further appreciated, that the use of the present invention as illustrated in FIG. 2 permits the computer system to allocate memory banks for certain types of data based on the translated virtual row address, and particularly, the lowest translated physical row address bits. Generally, it has been found that in most computer systems approximately 50% of processor memory fetches are for instructions, and approximately 50% of the memory fetches are for data. In current generation RISC processors, approximately 20% of the memory fetch operations are to obtain data and approximately 80% of the fetch operations are to obtain instructions. Accordingly, the use of the present invention permits an effective "cache" to be defined in one or more memory banks, such that localized subsets of memory may be accessed very quickly. In other words, the computer system's operating system may keep track of the data and instructions stored in memory and place data in, for example, even numbered memory banks and instructions in odd number memory banks, or vice versa. Accordingly, the probability for sequential memory access by the processor for any DRAM bank having identical virtual row addresses may be significantly increased. The use of such a memory system architecture in conjunction with the hardware of the present invention, as illustrated in FIG. 2, obviates in many cases the need for a separate cache based system. In addition, it will be noted by one skilled in the art that although FIG. 2 illustrates two banks of dynamic RAM memory, that the embodiment illustrated may be expanded to a plurality of banks, each bank having a corresponding latch and comparator circuit, wherein the number of lowest translated physical bits used to enable specific latches is a function of the number of dynamic RAM banks utilized.

Figure 3:
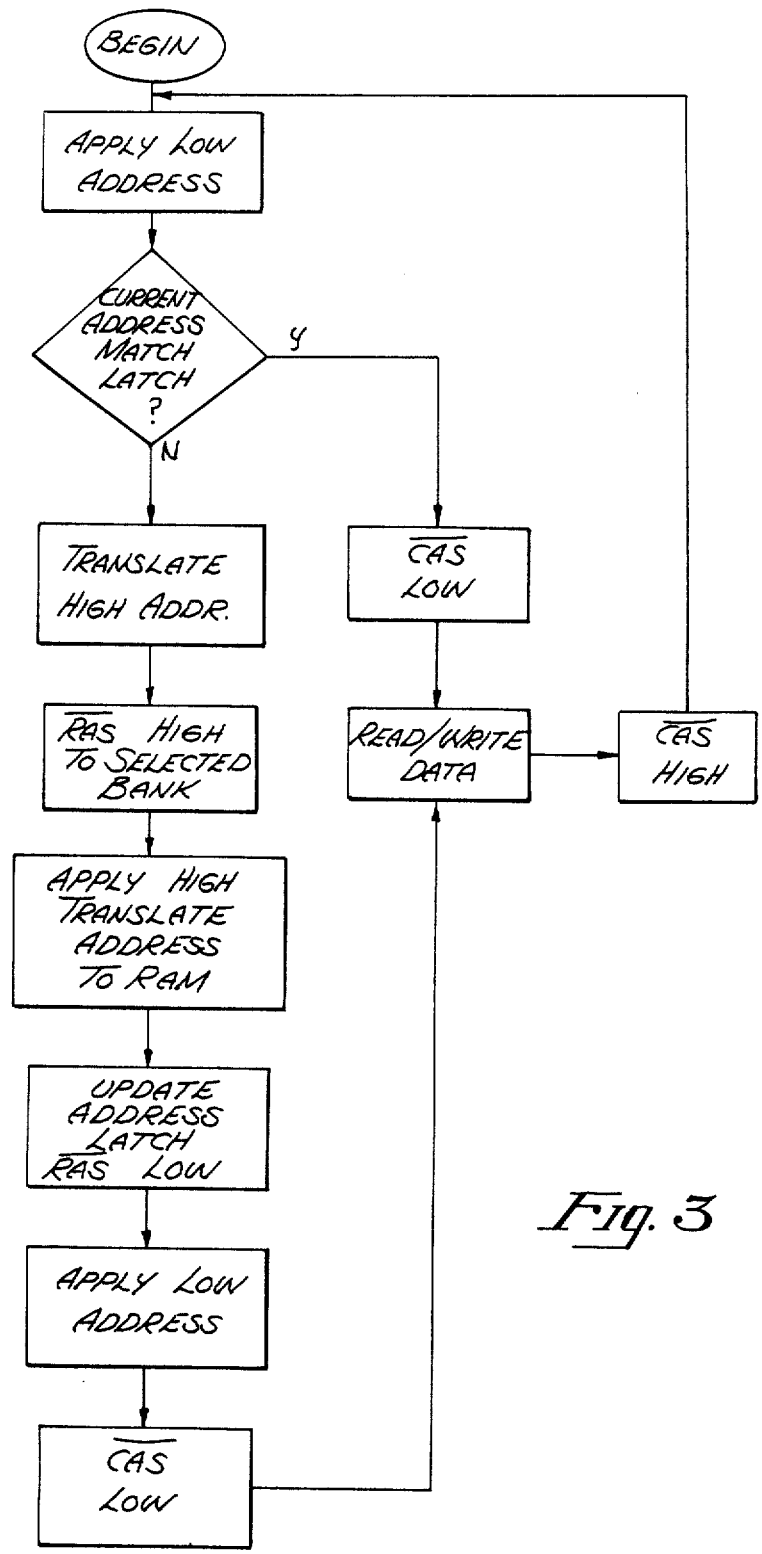
FIG. 3 is a flow chart identifying the sequence of operations of the embodiment illustrated in FIG. 2.

Although the present invention has been described with reference to FIGS. 1–3, it will be appreciated that the Figures are for illustration only, and that the present invention may be used in numerous other memory applications.

I claim:

1. A memory access system comprising:
   memory means for storing data, said memory means including N banks of memory arrays, each of said memory arrays comprising a dynamic random access memory having static column access, wherein data is stored at a plurality of locations, each of said locations specified by a real row address and a column address and wherein said data at said specified location is accessed after receipt of said real row address followed by a row address strobe (RAS) signal and said column address followed by a column address strobe (CAS) signal;
   address generation means for generating a virtual row address and said column address corresponding to a desired data location in one of said memory arrays, said address generation means comprising a processor;
   latch means electrically connected to said address generation means, said latch means including N latches, one for each of said N banks of memory arrays, for receiving said virtual row address and storing said virtual row address upon receipt of a clock signal;
   comparator means electrically connected to said latch means and said address generation means, said comparator means including N comparators, one for each of said N banks of memory arrays, for comparing a current virtual row address from said address generation means to a preceding virtual row address currently stored in said latch means and for providing an output indicating the results of said comparison, said comparator means further including an OR gate for receiving the outputs of said comparators and providing an output;
   a memory management unit (MMU) for translating said virtual row address into a real row address;
   cycle control means electrically connected to said output of said OR gate, said latch means, said MMU, and said memory means for receiving said comparator output and for providing said real row and column addresses and said RAS and CAS signals to said one memory array, wherein said real row address and said RAS signal are provided to said one memory array only if said comparator output indicates that said current virtual row address is not the same as said preceding virtual row address, and wherein only said column address and said CAS signal are provided to said one memory array when said comparator output indicates that said current virtual row address is the same as said preceding virtual row address;
   said cycle control means including clock means for providing said clock signal when said comparator output indicates that said current virtual row address is not the same as said preceding virtual row address.

2. The memory access system as defined by claim 1, wherein the outputs of said N comparators are electrically connected to said cycle control means.

3. The memory access system as defined by claim 2, wherein Y lowest translated physical bits from said MMU are electrically connected to said N latches such that one of said latches is enabled as a function of the value of said Y bits.

4. The memory access system as defined by claim 3, wherein data in said N banks of memory arrays are organized such that certain of said banks store a higher percentage of instructions then data compared to other of said banks.

5. The memory access system as defined by claim 4, wherein said data is organized to increase the probability of consecutive memory accesses to the same row address as previous accesses.

6. The memory access system as defined by claim 5 wherein said data organization is controlled by an operating system comprising instructions executed by said processor.

7. The memory access system as defined by claim 6, wherein said column addresses supplied by said address generation means are real addresses.

8. The memory access system as defined by claim 7, wherein said translated real row address and said real column address are selectively coupled to one of said memory arrays by a multiplexer upon command of said cycle control means.

9. An improved method for accessing a computer memory including N banks of memory arrays, each of said memory arrays comprising a dynamic random access memory having static column access, wherein data is stored in at least one of said memory arrays at a plurality of locations, each of said locations specified by a real row address and a column address and wherein said data at said specified location is accessed after receipt of said real row address followed by a row address strobe (RAS) signal and said column address followed by a column address strobe (CAS) signal, comprising the steps of:
   storing a virtual row address in latch means upon receipt of a clock signal, said latch means including N latches, one for each of said N banks of memory arrays;
   generating, in a processor, a current virtual row address and a current column address corresponding to desired data in said one memory array;
   comparing said current virtual row address to said virtual row address stored in said latch means using N comparators, one for each of said N banks of memory arrays, outputs of said N comparators being input to an OR gate;

translating, in a memory management unit (MMU), said current virtual row address into a current real row address;

providing said current real row address, said current column address and said RAS and CAS signals to said one memory array as a function of said comparison such that said current real row address and said RAS signal are provided to said one memory array only if said current virtual row address is not the same as said virtual row address stored in said latch means and such that only said column address and said CAS signal are provided if said current virtual row address is the same as said virtual row address stored in said latch means;

providing said clock signal to store said current virtual row address in said latch means when said current virtual row address is not the same as said virtual row address stored in said latch means.

10. The method as defined by claim 9, wherein the outputs of said N comparators are coupled to said cycle control means.

11. The method as defined by claim 10, wherein Y lowest translated physical bits from said MMU are coupled to said latches such that the value of said Y bits corresponds to at least one of said latches and memory banks, thereby enabling said corresponding latch.

12. The method as defined by claim 11, wherein data in said N banks of memory arrays are organized such that certain of said banks store a higher percentage of instructions then data compared to other of said banks.

13. The method as defined by claim 12, wherein said data is organized to increase the probability of consecutive memory accesses to the same row address as previous accesses.

14. The method as defined by claim 13, wherein said data organization is controlled by an operating system comprising instructions executed by said processor.

15. The method as defined by claim 14, wherein said generated column address is a real address.

* * * * *

UNITED STATES PATENT AND TRADEMARK OFFICE
CERTIFICATE OF CORRECTION

PATENT NO. : 4,803,621
DATED : 2/7/89
INVENTOR(S) : Kelly

It is certified that error in the above-identified patent and that said Letters Patent is hereby corrected as shown below:

| | | |
|---|---|---|
| col. 06, line 09 | after "60" | insert --to-- |
| col. 07, line 60 | after "said" | insert --N-- |

Signed and Sealed this

Twelfth Day of February, 1991

*Attest:*

HARRY F. MANBECK, JR.

*Attesting Officer*     *Commissioner of Patents and Trademarks*